US010811120B2

(12) United States Patent
Wu (10) Patent No.: US 10,811,120 B2
(45) Date of Patent: Oct. 20, 2020

(54) METHOD FOR PERFORMING PAGE AVAILABILITY MANAGEMENT OF MEMORY DEVICE, ASSOCIATED MEMORY DEVICE AND ELECTRONIC DEVICE, AND PAGE AVAILABILITY MANAGEMENT SYSTEM

(71) Applicant: Silicon Motion Inc., Hsinchu (TW)

(72) Inventor: Po-Wei Wu, Keelung (TW)

(73) Assignee: Silicon Motion, Inc., Hsinchu County (TW)

( * ) Notice: Subject to any disclaimer, the term of this patent is extended or adjusted under 35 U.S.C. 154(b) by 57 days.

(21) Appl. No.: 16/141,983

(22) Filed: Sep. 26, 2018

(65) Prior Publication Data

US 2019/0347028 A1 Nov. 14, 2019

(30) Foreign Application Priority Data

May 14, 2018 (TW) .............................. 107116235 A (51) Int. Cl.
*G11C 29/00* (2006.01)
*G06F 3/06* (2006.01)
(Continued)

(52) U.S. Cl.
CPC .......... *G11C 29/883* (2013.01); *G06F 3/0604* (2013.01); *G06F 3/0616* (2013.01); *G06F 3/0619* (2013.01); *G06F 3/0644* (2013.01); *G06F 3/0679* (2013.01); *G06F 11/1068* (2013.01); *G11C 29/52* (2013.01)

(58) Field of Classification Search
None
See application file for complete search history.

(56) References Cited

U.S. PATENT DOCUMENTS

2009/0055680 A1 2/2009 Honda
2009/0132876 A1* 5/2009 Freking ................. G06F 11/106
714/723

(Continued)

FOREIGN PATENT DOCUMENTS

CN 101339525 A 1/2009
CN 102033791 A 4/2011
(Continued)

*Primary Examiner* — Steve N Nguyen
(74) *Attorney, Agent, or Firm* — Winston Hsu (57) ABSTRACT

A method for performing page availability management of a memory device, the associated memory device and electronic device, and page availability management system are provided. The method may include: obtaining a set of page Error Correction Code (ECC) error tables of a non-volatile (NV) memory; based on a predetermined rule, finding respective local risky pages of at least one portion of blocks within a plurality of blocks according to the set of page ECC error tables, respectively, to generate local risky page counts respectively corresponding to page indexes; finding one or more global risky pages corresponding to one or more page indexes of the multiple page indexes according to the local risky page counts; and writing a global risky page table into the memory device, for controlling the memory device to skip using the one or more global risky pages of each of the plurality of blocks.

17 Claims, 6 Drawing Sheets

(51) Int. Cl.
*G06F 11/10* (2006.01)
*G11C 29/52* (2006.01)

(56) References Cited

U.S. PATENT DOCUMENTS

| | | | | |
|---|---|---|---|---|
| 2010/0122148 | A1* | 5/2010 | Flynn | G06F 11/108 |
| | | | | 714/773 |
| 2012/0216094 | A1 | 8/2012 | Yoo | |
| 2012/0254686 | A1* | 10/2012 | Esumi | H03M 13/2906 |
| | | | | 714/763 |
| 2014/0115423 | A1* | 4/2014 | Cooke | H03M 13/15 |
| | | | | 714/763 |
| 2015/0143054 | A1* | 5/2015 | Ackaret | G06F 11/073 |
| | | | | 711/133 |
| 2015/0177995 | A1* | 6/2015 | Camp | G06F 11/10 |
| | | | | 711/103 |
| 2015/0242143 | A1* | 8/2015 | Kim | G11C 16/349 |
| | | | | 714/704 |

FOREIGN PATENT DOCUMENTS

| | | |
|---|---|---|
| CN | 103348326 B | 3/2016 |
| CN | 104637542 B | 3/2018 |
| WO | 2007/010829 A1 | 1/2007 |

* cited by examiner

METHOD FOR PERFORMING PAGE AVAILABILITY MANAGEMENT OF MEMORY DEVICE, ASSOCIATED MEMORY DEVICE AND ELECTRONIC DEVICE, AND PAGE AVAILABILITY MANAGEMENT SYSTEM

BACKGROUND OF THE INVENTION

1. Field of the Invention

The present invention is related to access of a flash memory, and more particularly, to a method for performing page availability management of a memory device, the associated memory device and electronic device, and a page availability management system.

2. Description of the Prior Art

Developments in memory technology have led to the wide applications of portable or non-portable memory devices (e.g. a memory card conforming to the SD/MMC, CF, MS or XD specification, a solid-state drive, and an embedded memory device conforming to the UFS or eMMC specification). Thus, improving access control of memories in these memory devices remains an issue to be solved in the art.

NAND flash memories may typically comprise single level cell (SLC) and multiple level cell (MLC) flash memories. In an SLC flash memory, each transistor used as a memory cell may have any of two electrical charge values, respectively representing the logic values 0 and 1. In addition, the storage ability of each transistor used as a memory cell in an MLC flash memory may be fully utilized, where the transistor is driven by a voltage higher than that in the SLC flash memory, to record information of at least two bits (e.g. 00, 01, 11, or 10) in a transistor through different voltage levels. In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, utilizing new technologies to produce flash memories may make memory devices with large capacity become popular. When a downgraded flash die is applied to a memory device with less capacity, the memory device equipped with the downgraded flash die may have various issues, such as data error, write/read test failure during manufacturing, etc. Thus, a novel method and associated architecture are needed for improving performance of memory devices without introducing any side effect or in a way that is less likely to introduce a side effect.

SUMMARY OF THE INVENTION

An objective of the present invention is to provide a method for performing page availability management of a memory device, the associated memory device and electronic device, and a page availability management system, to solve the aforementioned problems.

Another objective of the present invention is to provide a method for performing page availability management of a memory device, the associated memory device and electronic device, and a page availability management system, to achieve optimal performance of memory devices without introducing any side effect or in a way that is less likely to introduce a side effect.

At least one embodiment of the present invention provides a method for performing page availability management of a memory device, wherein the method is applicable to a page availability management system coupled to the memory device. The memory device comprises a non-volatile (NV) memory, the NV memory comprises one or more NV memory elements, and the one or more NV memory elements comprise a plurality of blocks. For example, the method comprises: obtaining a set of page Error Correction Code (ECC) error tables of the NV memory, wherein the set of page ECC error tables correspond to the plurality of blocks, respectively, and each page ECC error table within the set of page ECC error tables comprises respective ECC error bit counts of pages of a corresponding block within the plurality of blocks; based on a predetermined rule, finding respective local risky pages of at least one portion of blocks within the plurality of blocks according to the set of page ECC error tables, respectively, to generate local risky page counts respectively corresponding to multiple page indexes, wherein the multiple page indexes correspond to respective pages of each of the plurality of blocks, respectively, and regarding a same block within the at least one portion of blocks, one or more ECC error bit counts of one or more local risky pages existing in the same block are greater than ECC error bit counts of other pages within the same block; finding one or more global risky pages corresponding to one or more page indexes of the multiple page indexes according to the local risky page counts, wherein one or more local risky page counts corresponding to the one or more page indexes are greater than other local risky page counts within the local risky page counts; and writing a global risky page table into the memory device, for controlling the memory device to skip using the one or more global risky pages of each of the plurality of blocks, wherein the global risky page table indicates the one or more global risky pages.

According to some embodiments, the present invention further provides the memory device which may operate according to the global risky page table generated through the aforementioned method. The memory device may comprise: the NV memory, arranged to store information; and a controller, coupled to the NV memory, arranged to control operations of the memory device. The controller may comprise: a processing circuit, arranged to control the controller according to a plurality of host commands from a host device, to allow the memory device to access the NV memory through the controller. In addition, according to the global risky page, the controller controls the memory device to skip using the one or more global risky pages of each of the plurality of blocks.

According to some embodiments, the present invention further provides an electronic device which may comprise the aforementioned memory device and further comprise the host device that may be coupled to the memory device. The host device may comprise: at least one processor, arranged to control operations of the host device; and a power supply circuit, coupled to the at least one processor, arranged to provide the at least one processor and the memory device with power. In addition, the memory device may be arranged to provide the host device with storage space.

According to some embodiments, the present invention further provides a page availability management system which may operate according to the aforementioned method. The page availability management system may comprise: a processing circuit, arranged to control the page availability management system according to the method, to write the global risky page table into the memory device, for controlling the memory device to skip using the one or more global risky pages of each of the plurality of blocks.

One of advantages of the present invention is that the method and associated devices of the present invention may perform proper control regarding the operation of the controller, to achieve the optimal performance of the memory devices. More particularly, when flash memory manufacturers utilize a new technology to produce flash memories having extremely large storage space, the method and associated devices of the present invention may fully utilize flash dies of various grades provided by the flash memory manufacturers. In addition, implementing according to the embodiments of the present invention will not greatly increase additional costs. Thus, problems existing in the related art can be solved without greatly increasing the overall cost. In comparison with the related art, the present invention can achieve optimal performance of memory devices without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory system

Figure 1:
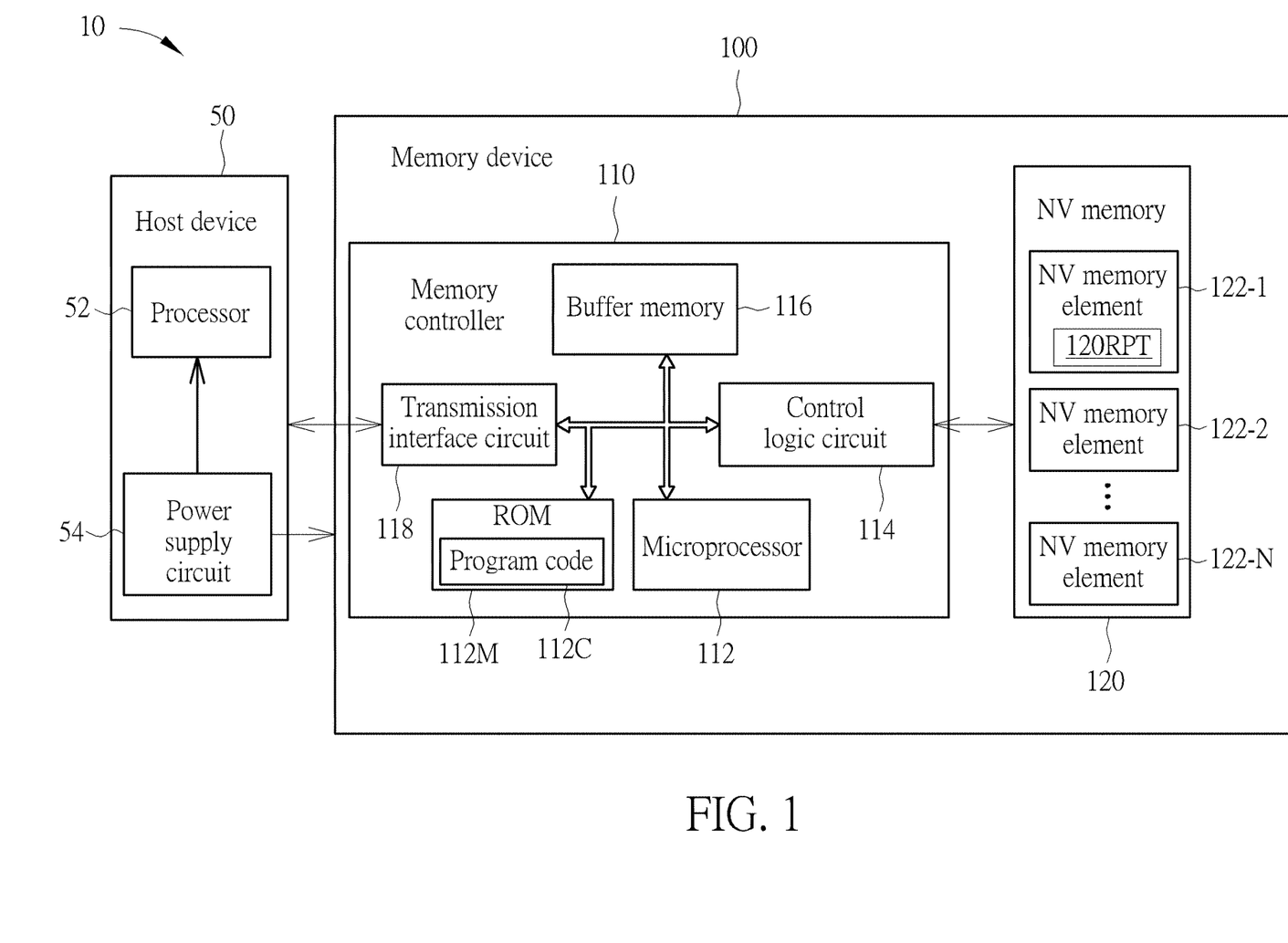
FIG. 1 is a diagram of a memory device and a host device according to an embodiment of the present invention.

FIG. 1 is a diagram of an electronic device 10 according to an embodiment of the present invention, where the electronic device 10 comprises a host device 50 and a memory device 100. The host device 50 may comprises: at least one processor 52 (e.g. one or more processors), arranged to control operations of the host device 50; and a power supply circuit 54, coupled to the aforementioned at least one processor 52, arranged to provide the aforementioned at least one processor 52 and the memory device 100 with power, and output one or more driving voltages to the memory device 100, where the memory device 100 may provide the host device 50 with storage space, and may obtain the one or more driving voltages from the host device 50, to be the power of the memory device 100. Examples of the host device 50 may include, but are not limited to: a multifunctional mobile phone, a tablet computer, a wearable device, and a personal computer such as a desktop computer and a laptop computer. Examples of the memory device 100 may include, but are not limited to: a portable memory device (e.g. a memory card conforming to the SD/MMC, CF, MS or XD specification), a solid state drive (SSD), and various types of embedded memory devices (e.g. am embedded memory device conforming to the UFS or eMMC specification). According to this embodiment, the memory device 100 may comprise a controller such as a memory controller 110, and may further comprise a non-volatile (NV) memory 120, where the controller is arranged to access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips (which may be referred to as flash chips) or a plurality of flash memory dies (which may be referred to as flash dies), respectively, but the present invention is not limited thereto.

As shown in FIG. 1, the memory controller 110 may comprise a processing circuit such as a microprocessor 112, a storage unit such as a read only memory (ROM) 112M, a control logic circuit 114, a buffer memory 116, and a transmission interface circuit 118, where at least one portion (e.g. a portion or all) of the above components may be coupled to one another via a bus. The buffer memory 116 is implemented by a random access memory (RAM) (which may be a static RAM (SRAM), for example), where the RAM may be arranged to provide the memory controller 110 with internal storage space (for example, may temporarily store information), but the present invention is not limited thereto. In addition, the ROM 112M of this embodiment is arranged to store a program code 112C, and the microprocessor 112 is arranged to execute the program code 112C to control the access of the NV memory 120. Please note that, the program code 112C may also be stored in the buffer memory 116 or any type of memory. Additionally, the control logic circuit 114 maybe arranged to control the NV memory 120. The control logic circuit 114 may comprise an error correction code (ECC) circuit (not shown in FIG. 1), which may perform ECC encoding and ECC decoding, to protect data, and/or perform error correction, and the transmission interface circuit 118 may conform to a specific communications specification (e.g. the Serial Advanced Technology Attachment (SATA) specification, Universal Serial Bus (USB) specification, Peripheral Component Interconnect Express (PCIE) specification, embedded Multi Media Card (eMMC) specification, or Universal Flash Storage (UFS) specification), and may perform communications according to the specific communications specification.

In this embodiment, the host device 50 may transmit a plurality of host commands and corresponding logical addresses to the memory controller 110, to access the NV memory 120 within the memory device 100, indirectly. The memory controller 110 receives the plurality of host commands and the logical addresses, and translates the plurality of host commands into memory operating commands (which may be referred to as operating commands, for brevity), respectively, and further controls the NV memory 120 with the operating commands to perform reading or writing/programing upon the memory units or data pages of specific physical addresses within the NV memory 120, where the physical addresses correspond to the logical addresses. For example, the memory controller 110 may generate or update at least one logical-to-physical address mapping table to manage the relationship between the physical addresses and the logical addresses. The NV memory 120 may store a global risky page table 120RPT, for the memory controller 110 to control the memory device to prevent using some risky pages. When needed, the memory controller 110 may load the global risky page table 120RPT into the buffer memory 116 or other memories. The global risky page table 120RPT may be located in a predetermined region within the NV memory element 122-1, such as a system region, but the present invention is not limited thereto. In some embodiments, the global risky page table 120RPT may be located in a predetermined region within any of the NV memory elements 122-1, 122-2, ..., and 122-N, such as a system region.

In addition, the aforementioned at least one NV memory element (e.g. the one or more NV memory elements such as {122-1, 122-2, ..., 122-N}) may comprise a plurality of blocks, where the minimum unit that the memory controller 110 may perform operations of erasing data on the NV memory 120 may be a block, and the minimum unit that the memory controller 110 may perform operations of writing data on the NV memory 120 may be a page, but the present invention is not limited thereto. For example, any NV memory element 122-n (where "n" may represent any integer in the interval [1,N]) within the NV memory elements 122-1, 122-2, ..., and 122-N, may comprise multiple blocks, and a block within the multiple blocks may comprise and record specific number of pages, where the memory controller 110 may access a certain page of a certain block within the multiple blocks according to a block address and a page address. For another example, the NV memory element 122-n may comprise multiple planes, where a plan may comprise a set of blocks such as the aforementioned multiple blocks, and the memory controller 110 may specify a certain plane within the multiple planes according to a plane number, to access a certain page of a certain block of this plane. As the total number of blocks increases, the storage space of the NV memory 120 may become larger. Regarding manufacturing the NV memory 120, many technologies may be utilized, for example: a 2D/planar NAND flash technology, which may arrange memory cells into a single layer; and a 3D NAND flash technology, which may arrange the memory cells into a vertical stack of multiple layers. According to some embodiments, the NV memory 120 may be implemented as a 2D/planar NAND flash structure with the memory cells arranged in a single layer. According to some embodiments, the NV memory 120 may be implemented as a 3D NAND flash structure with multiple layers of memory cells stacked vertically. In this situation, the storage space of the NV memory 120 may become very large.

II. Multi-Screening Mechanism

Figure 2:
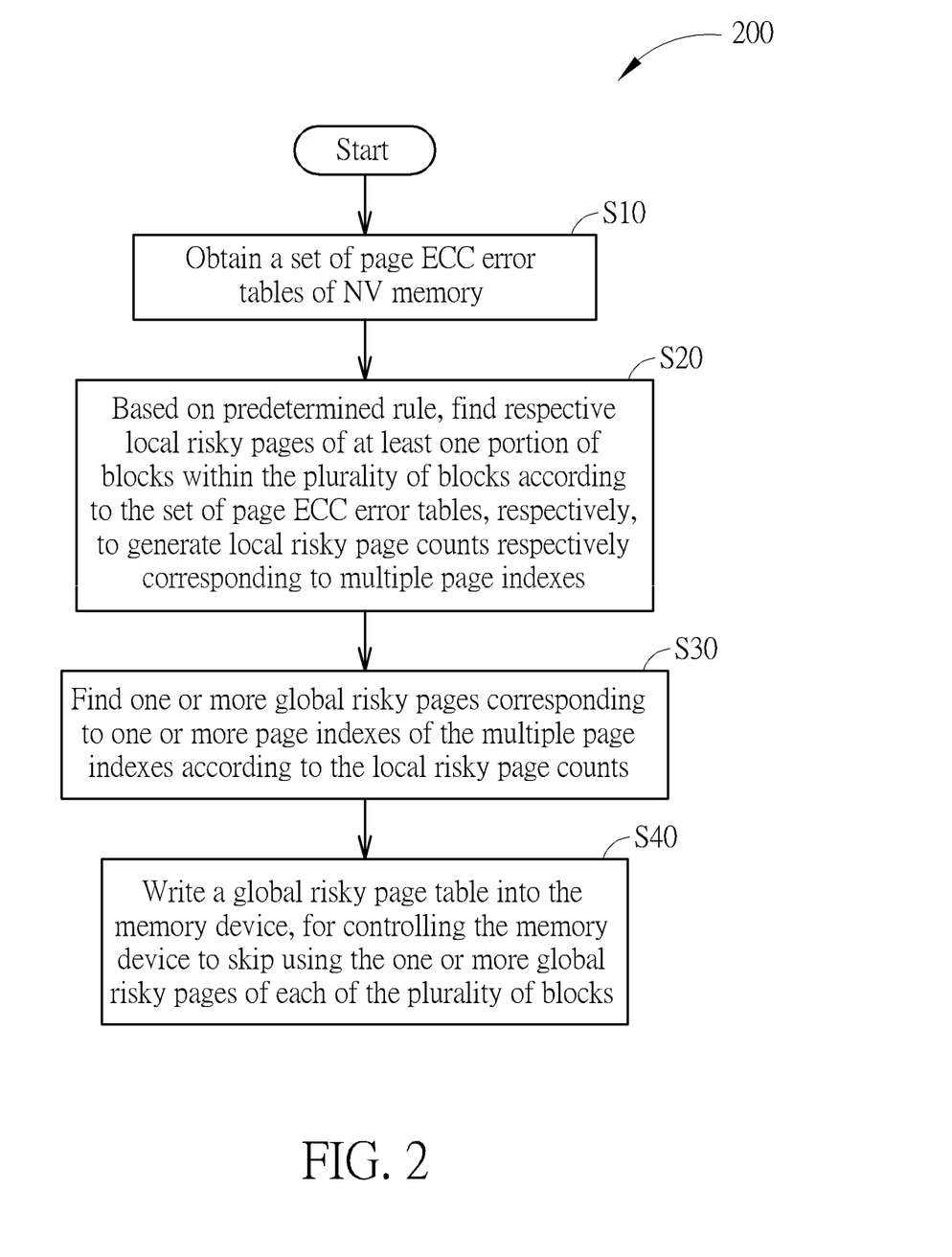
FIG. 2 is a flowchart of a method for performing a page availability management (PAM) of a memory device according to an embodiment of the present invention, where the method may be applied to the memory device shown in FIG. 1.

FIG. 2 is a flowchart of a method 200 for performing a page availability management (PAM) of a memory device according to an embodiment of the present invention, where the method 200 may be applied to the electronic device 10 shown in FIG. 1, and more particularly, to the host device 50 and the memory device 100 therein. For example, a PAM system provided by the present invention may operate according to the method 200, and more particularly, the PAM system may be implemented as a host device such as the host device 50 shown in FIG. 1.

In Step S10, the PAM system (e.g. the host device 50) may obtain a set of page ECC error tables of the NV memory 120 from the memory device 100, where the set of page ECC error tables correspond to the plurality of blocks, respectively, and each page ECC error table within the set of page ECC error tables comprises respective ECC error counts of pages of a corresponding block within the plurality of blocks.

In Step S20, based on a predetermined rule, the PAM system (e.g. the host device 50) may find respective local risky pages of at least one portion of blocks within the plurality of blocks according to the set of page ECC error tables, respectively, to generate local risky page counts respectively corresponding to multiple page indexes, such as M local risky page counts {LRPC(0), LRPC(1), ..., LRPC(M-1)} respectively corresponding to M page indexes {IND(0), IND(1), ..., IND(M-1)}. The multiple page indexes correspond to respective pages of each of the plurality of blocks, respectively. Regarding a same block within the aforementioned at least one portion of blocks, one or more ECC error bit counts of one or more local risky pages existing in the same block are greater than the ECC error bit counts of other pages within the same block. For better comprehension, the memory controller 110 may specify any block within the plurality of blocks through a block address for access, and the multiple page indexes such as the M page indexes {IND(0), IND(1), ..., IND(M-1)} may represent M page addresses {ADD(0), ADD(1), ..., ADD(M-1)}, respectively, which may direct to M pages within this block, such as page {PAGE(0), PAGE(1), ..., PAGE(M-1)}, for the memory controller 110 to access the M pages, but the present invention is not limited thereto.

In Step S30, the PAM system (e.g. the host device 50) may find one or more global risky pages corresponding to one or more page indexes of the multiple page indexes according to the local risky page counts, where one or more local risky page counts corresponding to the one or more page indexes are greater than other local risky page counts within the local risky page counts.

In Step S40, the PAM system (e.g. the host device 50) may write the global risky page table 120RPT into the memory device 100, for controlling the memory device 100 to skip using the one or more global risky pages of each of the plurality of blocks, where the global risky page table 120RPT indicates the one or more global risky pages. The memory device 100 may perform any of some operations such as address masking, address mapping, and address transforming, to prevent using the one or more global risky pages corresponding to the one or more page indexes. For example, when the value of a byte BYTE(0) within the global risky page table 120RPT is 0xCF (or 11001111b), it means that the pages {PAGE(0), PAGE(1), PAGE(2), PAGE (3), PAGE(6), PAGE(7)} are available, and the pages {PAGE(4), PAGE(5)} are unavailable, but the present invention is not limited thereto. In this embodiment, the PAM system (such as the host device 50) may comprise a processing circuit (e.g. the processor 52), and the processing circuit may control the PAM system according to the method 200, in order to write the global risky page table 120RPT into the memory device 100, for controlling the memory device 100 to skip using the one or more global risky pages of each of the plurality of blocks.

For example, in a situation where M=258, the M pages of a specific block within the plurality of blocks may comprise 258 pages such as the pages {PAGE(0), PAGE(1), ..., PAGE(257)} (e.g. the values {0, 1, ..., 257} in the parentheses of the symbol "PAGE( )" may represent the page indexes), and for the specific block, the respective ECC error bit counts may be M error bit counts such as the following 258 hexadecimal values: (which are listed by order)

```
{
19 19 14 1D 23 14 1D 1F 11 19 1E 14 18 1B 12 1A
1B 13 1B 19 13 19 17 18 19 1D 18 1A 1A 14 1C 1B
0F 19 1E 18 1A 1C 14 1B 1A 18 17 1A 16 1C 1C 10
17 14 11 1C 17 15 18 12 12 18 16 17 13 1C 0F 17
16 14 17 18 16 19 1A 1C 18 1A 13 19 17 1C 19 1D
13 16 18 11 19 1B 10 17 17 16 18 1A 17 14 1C 11
12 20 15 18 1E 17 16 18 14 18 19 1C 15 1A 17 14
18 12 15 18 10 18 1A 19 12 19 11 15 18 13 13 15
12 15 1C 14 13 16 14 11 1A 15 13 16 14 14 1A 14
14 1A 16 13 17 11 14 1C 1A 16 19 20 12 1C 18 12
16 17 11 16 18 11 19 16 12 1A 18 12 1A 16 13 15
14 14 17 16 11 17 12 12 18 16 11 19 15 11 1A 14
11 19 14 14 17 14 12 17 14 0F 15 14 0F 16 16 14
17 1C 14 16 1A 12 1A 15 13 16 17 15 19 19 12 17
17 11 13 1E 11 18 19 15 21 16 11 1E 15 16 15 1A
0C 16 18 0A 13 14 10 15 15 0E 13 16 0B 14 10 03
01 00
}
``` where the PAGE(0) has 19 (in hexadecimal format, i.e. 0x19) error bits, the PAGE(1) has 19 (in hexadecimal format, i.e. 0x19) error bits, ..., the rest may be deduced by analogy, and the PAGE(257) has 0 error bit.

Regarding Step S10, the PAM system (e.g. the host device 50) may perform the following operations: transmitting at least one writing command to the memory device 100, to write data into the pages of the corresponding block (e.g. the pages {PAGE(0), PAGE(1), ..., PAGE(257)}); transmitting at least one other command to the memory device 100, to trigger the memory device 100 to generate the respective ECC error bit counts (e.g. the above 258 ECC error bit counts {19, 19, 14, ..., 01, 00}, in the situation where the corresponding block represents the specific block) of the pages of the corresponding block while reading the data from the pages of the corresponding block; and obtaining the respective ECC error bit counts of the pages of the corresponding block from the memory device 100, for being stored as the aforementioned each page ECC error table. For example, regarding writing the data into the pages of the corresponding block, the memory device 100 (e.g. the ECC circuit) may perform ECC encoding to protect the data. For another example, the aforementioned at least one other command may comprise at least one reading command. Regarding reading the data from the pages of the corresponding block, when one or more error bits exist in any page within the pages, the memory device 100 (e.g. the ECC circuit) may perform ECC decoding to correct the one or more error bits, and may output a bit count of the one or more error bits to be an ECC error bit count of this page.

Figure 3:
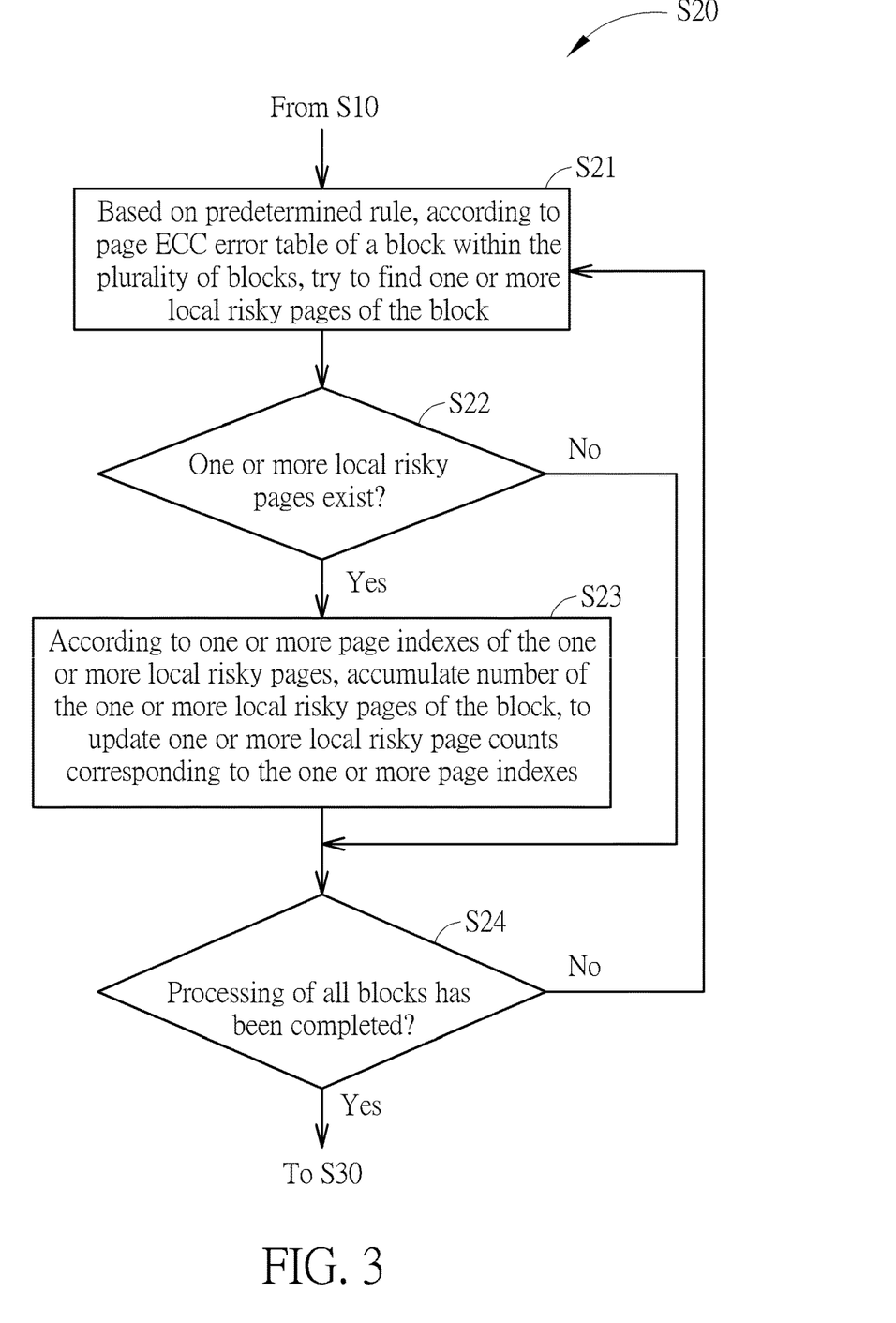
FIG. 3 illustrates implementation details of the method shown in FIG. 2 according to an embodiment of the present invention.

FIG. 3 illustrates implementation details of the method 200 shown in FIG. 2 according to an embodiment of the present invention. Regarding Step S20, the PAM system (e.g. the host device 50) may accumulating a number of the respective local risky pages of the aforementioned at least one portion of blocks according to the multiple page indexes, to generate the local risky page counts respectively corresponding to the multiple page indexes, such as the M local risky page counts {LRPC(0), LRPC(1), ..., LRPC(M-1)}.

In Step S21, based on the predetermined rule, according to a page ECC error table of a block within the plurality of blocks, the PAM system (e.g. the host device 50) may try to find one or more local risky pages of the block. For example, this block may be selected from block(s) that have not been processed through Step S21 within the plurality of blocks.

In Step S22, the PAM system (e.g. the host device 50) may check whether the one or more local risky pages (mentioned in Step S21) exist. When the one or more local risky pages exist, Step S23 is entered; otherwise, Step S24 is entered.

In Step S23, according to one or more page indexes of the one or more local risky pages (mentioned in Step S21), the PAM system (e.g. the host device 50) may accumulate a number of the one or more local risky pages of the block, to update one or more local risky page counts corresponding to the one or more page indexes.

In Step S24, the PAM system (e.g. the host device 50) may check whether the processing of all blocks (e.g. the plurality of blocks) has been completed. When the processing of all blocks has been completed (which means the local risky page counts such as the M local risky page counts {LRPC(0), LRPC(1), ..., LRPC(M-1)} have been generated through the workflow shown in FIG. 3), Step S30 is entered; otherwise, Step S21 is entered.

TABLE 1

| Page index | 0 | 1 | 2 | 3 | 4 | ... | 257 |
|---|---|---|---|---|---|---|---|
| Local risky page count | 69 | 11 | 18 | 10 | 133 | ... | 22 |

Table 1 shows an example of the local risky page counts such as the M local risky page counts {LRPC(0), LRPC(1), ..., LRPC(M-1)}, where in the situation where M=258, the 258 local risky page counts {LRPC(0), LRPC(1), ..., LRPC(257)} are {69, 11, ..., 22}, respectively, but the present invention is not limited thereto.

Figure 4:
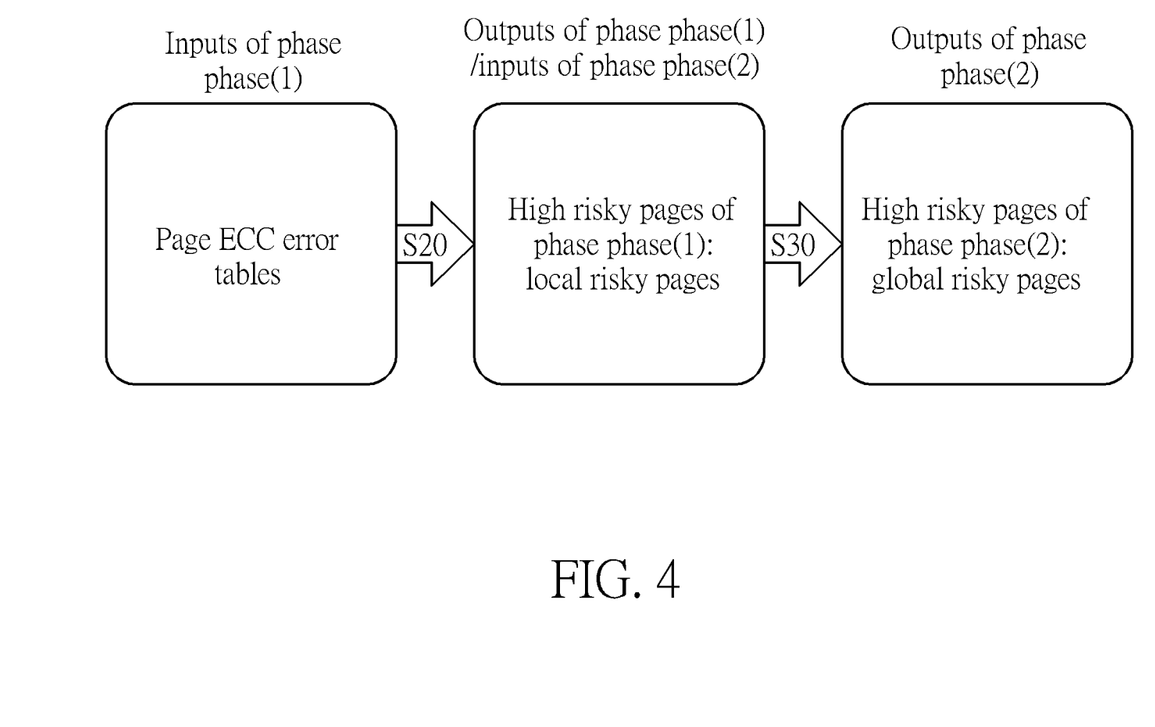
FIG. 4 illustrates a control scheme of the method shown in FIG. 2 according to an embodiment of the present invention.

FIG. 4 illustrates a control scheme of the method 200 shown in FIG. 2 according to an embodiment of the present invention, where the operations of Steps S20 and S30 maybe performed in phases Phase(1) and Phase(2). The set of page ECC error tables maybe regard as inputs of the phase Phase(1), the respective local risky pages of the aforementioned at least one portion of blocks may be regarded as outputs of the phase Phase(1) or inputs of the phase Phase(2), and the one or more global risky pages may be regarded as outputs of the phase Phase(2). In addition, high risky pages of the phase Phase(1) may comprise the local risky pages, and high risky pages of the phase Phase(2) may comprise the one or more global risky pages. More particularly, during or after extracting respective page ECC error tables of all blocks, the PAM system (e.g. the host device 50) may perform statistics on all blocks in the phase Phase(1) while assuming that all blocks conform to certain statistic distribution, to determine whether abnormal pages (such as pages having their uncorrectable ECC (UECC) error counts significantly more than that of others, or pages having their ECC error bit counts significantly more than that of others) exist, and may record these abnormal pages as local risky pages and vote according to the page indexes. For example, when the pages {PAGE(0), PAGE(18)} within the block BLOCK(0) are abnormal pages, count once regarding the page indexes {1, 18}, respectively; when the pages {PAGE(1), PAGE(66), PAGE(195)} within the block BLOCK(1) are abnormal pages, count once regarding the page indexes {1, 66, 195}, respectively; and the rest may be deduced by analogy. After the above processing (e.g. voting) of all blocks are completed, the PAM system (e.g. the host device 50) may analyze voting results respectively corresponding to the page indexes in the phase Phase(2), to determine whether one or more abnormal pages such as a page whose vote count (e.g. count value) is significantly higher than that of others exist while assuming that these vote counts (e.g. count values) conform to a certain statistic distribution, and may record the one or more abnormal pages as global risky pages. For example, the memory device 100 may avoid using these global risky pages. For another example, when real-time reading/writing is performed, the memory device 100 may perform special check on these global risky pages to online control whether to continue using these global risky pages. According to some embodiments, the aforementioned certain statistic distribution may be any of various types of distributions, and the operations of the phase Phase(1) and Phase(2) may be performed with iterative operations (e.g. remove the page PAGE(1) in the first iteration, and remove the page PAGE(66) in the second iteration, and so on).

According to some embodiments, the predetermined rule may comprise page screening corresponding to a first distribution model (e.g. normal distribution model). In Step S20, the PAM system (e.g. the host device 50) may perform the following operations: regarding the corresponding block corresponding to the aforementioned each page ECC error table, calculating an error bit count average and an error bit count standard deviation, such as an average AVG(1) and a standard deviation σ(1) of the respective ECC error bit counts, respectively, where the average AVG(1) and the standard deviation σ(1) correspond to the first distribution model; according to a product (PP(1)*σ(1)) of a first predetermined parameter PP(1) and the standard deviation σ(1) and according to the average AVG(1), determining a threshold TH(1) (which may be referred to as a first screening threshold), where TH(1)=AVG(1)+(PP(1)*σ(1)), and based on the first distribution model, an error bit count expected value corresponding to the threshold TH(1) is less than one; and checking whether an ECC error bit count of a page within the pages in the corresponding block reaches the threshold TH(1), to selectively determine whether the page is a local risky page, where whether the page is a local risky page corresponds to whether the ECC error bit count of the page reaches the threshold TH(1). For example, when the ECC error bit count of the page is greater than or equal to the threshold TH(1), the page is a local risky page, otherwise, the page is not a local risky page. For another example, when the ECC error bit count of the page is greater than the threshold TH(1), the page is a local risky page, otherwise, the page is not a local risky page.

In addition, in Step S30, the PAM system (e.g. the host device 50) may perform the following operations: calculating a page count average and a page count standard deviation, such as an average AVG(2) and a standard deviation σ(2) of the local risky page counts, respectively, where the average AVG(2) and the standard deviation σ(2) correspond to a second distribution model (e.g. normal distribution model); according to a product (PP(2)*σ(2)) of a second predetermined parameter PP(2) and the standard deviation σ(2) and according to the average AVG(2), determining a threshold TH(2) (which may be referred to as a second screening threshold), where TH(2)=AVG(2)+(PP(2)*σ(2)), and based on the second distribution model, a page count expected value corresponding to the threshold TH(2) is less than one; and checking whether a local risky page count within the local risky page counts reaches the threshold TH(2), to selectively determine whether a corresponding page is a global risky page, where whether the corresponding page is a global risky page corresponds to whether the local risky page count of the corresponding page reaches the threshold TH(2). For example, when the local risky page count of the corresponding page is greater than or equal to the threshold TH(2), the corresponding page is a global risky page, otherwise, the corresponding page is not a global risky page. For another example, when the local risky page count of the corresponding page is greater than the threshold TH(2), the corresponding page is a global risky page, otherwise, the corresponding page is not a global risky page.

Figure 5:
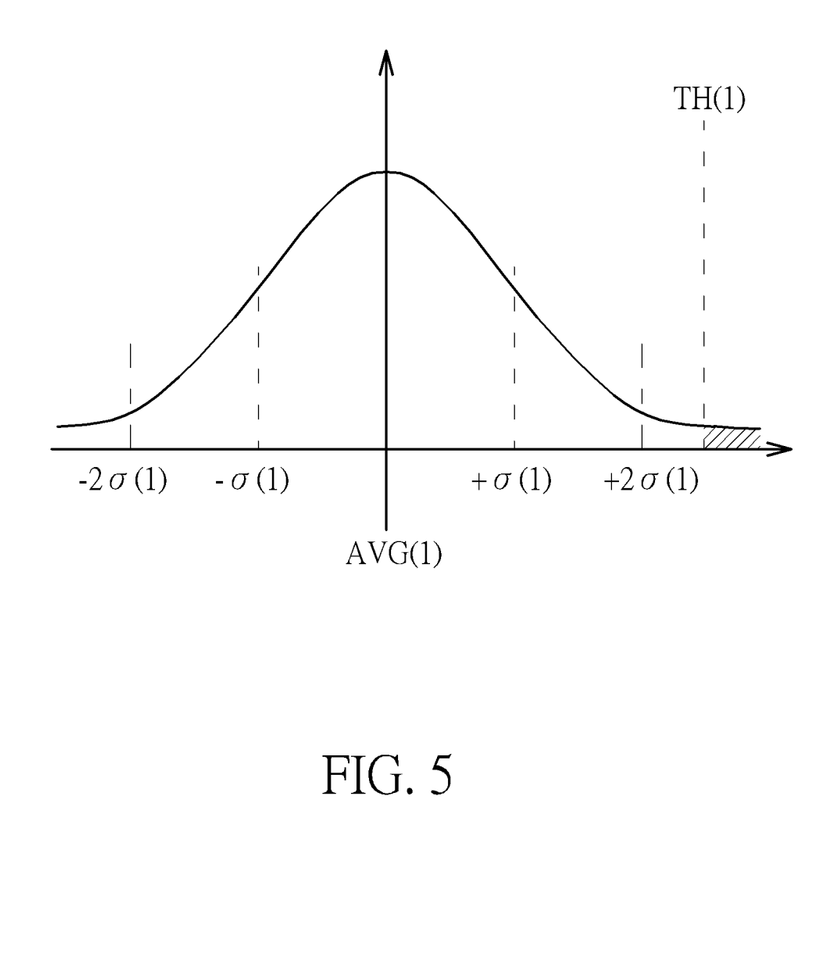
FIG. 5 illustrates an example of the first distribution model.
Figure 6:
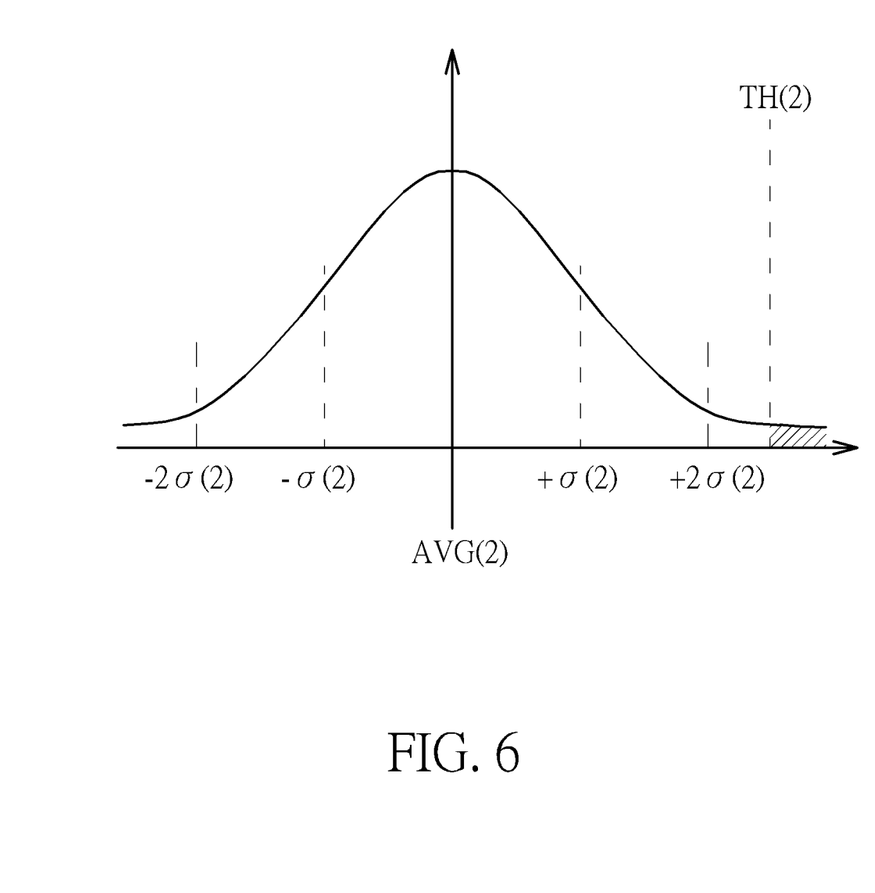
FIG. 6 illustrates an example of the second distribution model.

FIG. 5 and FIG. 6 respectively illustrate examples of the first distribution model and the second distribution model. The PAM system (e.g. the host device 50) may adjust related parameters such as PP(1) and PP(2) to adjust the thresholds TH(1) and TH(2) to make the respective expected value corresponding to the respective shaded portions under the curves be less than one (e.g. through a default setting or a user setting), where the horizontal axis and the vertical axis of FIG. 5 may represent the ECC error bit counts and sample counts, respectively, and the horizontal axis and the vertical axis of FIG. 6 may represent the local risky page counts and sample counts, respectively, but the present invention is not limited thereto. For example, the local risky page counts on the horizontal axis of FIG. 6 may be also regarded as the number of times, such as accumulated number of times corresponding to a same page index.

Provided that pages qualities are uniform, in a NAND flash die with excellent quality, the degree of excellent quality of all pages should be similar. For example, in the situation where M=258, respective ECC error bit counts of the 258 pages (such as the pages {PAGE(0), PAGE(1), ... , PAGE(257)}) of a block (such as the specific block) may be expected to correspond to normal distribution, so the PAM system (e.g. the host device 50) may calculate corresponding average u and standard deviation a (which may be taken as examples of the average AVG(1) and the standard deviation σ(1), respectively). For example, u=20 (bits) and σ=3.9. Probability of the error bit count being greater than (u+2.6σ) in normal distribution is 0.235%, and regarding 258 statistic values, the expected value that an extreme value (such as an outlier) appears is (258*0.235%)=0.6 (0.6<1), so, in a normal case, an error bit count greater than (u+2.6σ) should not appear. Based on this, the PAM system (e.g. the host device 50) may check the error bit count of each page of this block one by one. When an error bit count of any page is greater than (u+2.6σ) (such as (20+(2.6*3.9))=30.14), the PAM system (e.g. the host device 50) may count once with respect to the page index of this page to increase an accumulated number corresponding to this page index (e.g. the accumulated number of times that an abnormal page is found) with an increment of one. For example, in the aforementioned 258 hexadecimal values, the error bit count of the page PAGE(4) is 0x23, and 0x23=35 (bits), which is greater than 30.14, so the PAM system (e.g. the host device 50) may count once with respect to the page index 4 to increase the accumulated number corresponding to the page index 4; and the rest may be deduced by analogy. As a result, the PAM system (e.g. the host device 50) may generate the 258 local risky pages counts {LRPC(0), LRPC(1), ... , LRPC(257)}, such as the local risky page counts {69, 11, ... , 22} in Table 1. Based on the same hypothesis (e.g. the pages qualities are uniform), the 258 local risky pages counts {LRPC(0), LRPC(1), ... , LRPC(257)} may be expected to correspond to normal distribution, so the PAM system (e.g. the host device 50) may calculate corresponding average u' and standard deviation σ' (which may be taken as examples of the average AVG(2) and the standard deviation σ(2), respectively). For example, u'=21 (times) and σ'=6.6. Similarly, in a normal case, a local risky page count (or number of times) greater than (u'+2.6σ') should not appear. Based on this, the PAM system (e.g. the host device 50) may check each of the 258 local risky page counts {LRPC(0), LRPC(1), . . . , LRPC(257)} one by one. When a local risky page count LRPC(IND) is greater than (u'+2.6σ') (such as (21+(2.6*6.6))=38.16), it means that a page PAGE(IND) represented by the page index IND of the local risky page count LRPC(IND) belongs to high risky pages, and the PAM system (e.g. the host device 50) may determine the page PAGE(IND) to be a global risky page, and record corresponding information in the global risky page table 120RPT to indicate that the page PAGE(IND) is a global risky page. Taking the local risky page count {69, 11, . . . , 22} in Table 1 as an example, the PAM system (e.g. the host device 50) may determine the pages {PAGE(0), PAGE(4)} to be global risky pages. For example, through performing the above processing multiple times, the PAM system (e.g. the host device 50) may perform the aforementioned iterative operations, to find global risky page(s) in iteration every time, and exclude the global risky page (s) until the rest of pages are all normal pages (e.g. no risky page appears anymore). Regarding determinations of the related parameters such as PP(1) and PP(2), the PAM system (e.g. the host device 50) may utilize a default automatic determination mechanism (e.g. based on number of pages), or provide a user with user interface to allow the user to determine by themselves. For example, when each block within a certain flash die has 2304 pages, in a situation where all data are normal, probability of the error bit count being greater than (u+2.6σ) is 0.235%, where the corresponding expected value is 5.4 (pages), which means that the standard (e.g. the threshold TH(1)) for defining the extreme value is too strict. Therefore, the PAM system (e.g. the host device 50) may adjust PP(1), and more particularly, may increase PP(1). For example, PP(1)=3.5, where the probability of the error bit count being greater than (u+3.5σ) is 0.02%, and the corresponding expected value is (2304*0.02%)=0.46 (pages). Under this standard (e.g. TH(1)=(u+3.5σ)), if an error bit count of any page is still greater than (u+3.5σ), it means that the page is a high risky page indeed. In some embodiments, adjusting the related parameters such as PP(1) and PP(2) may comprise increasing and/or decreasing the parameters.

The method and associated device of the present invention can accurately find risky pages, for example, write/read each block and each page on a whole flash die indeed, and utilize statistic model to perform analyzing according to distribution of error bit counts generated when reading each page, in order to predict common available pages of each block for storing data. Regarding dies having new damaged pages that may appear during the process of data writing/reading (e.g. degraded flash dies), the method and associated device of the present invention can greatly improve yield in writing/reading tests.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing page availability management of a memory device, the method being applicable to a page availability management system coupled to the memory device, the memory device comprising a non-volatile (NV) memory, the NV memory comprising one or more NV memory elements, the one or more NV memory elements comprising a plurality of blocks, the method comprising:
   obtaining a set of page Error Correction Code (ECC) error tables of the NV memory, wherein the set of page ECC error tables correspond to the plurality of blocks, respectively, and each page ECC error table within the set of page ECC error tables comprises respective ECC error bit counts of pages of a corresponding block within the plurality of blocks;
   based on a predetermined rule, finding respective local risky pages of N blocks within the plurality of blocks according to the set of page ECC error tables, respectively, to generate local risky page counts respectively corresponding to multiple page indexes, wherein N is greater than one, the multiple page indexes correspond to respective pages of each of the plurality of blocks, respectively, and as for a single block within the N blocks, one or more ECC error bit counts of one or more local risky pages existing in the single block are not less than a first screening threshold;
   finding one or more global risky pages corresponding to one or more page indexes of the multiple page indexes according to the local risky page counts, wherein one or more local risky page counts corresponding to the one or more page indexes are not less than a second screening threshold; and
   writing a global risky page table into the memory device, for controlling the memory device to skip using the one or more global risky pages of each of the plurality of blocks, wherein the global risky page table indicates the one or more global risky pages;
   wherein each of the local risky page counts indicate a number of local risky pages within the N blocks regarding a corresponding page index;
   wherein when an ECC error bit count of a certain page reaches the first screening threshold, the certain page is determined to be a local risky page; and when a local risky page count corresponding to the certain page reaches the second screening threshold, the certain page is determined to be a global risky page.

2. The method of claim 1, wherein the step of obtaining the set of page ECC error tables of the NV memory further comprises:
   transmitting at least one writing command to the memory device, to write data into the pages of the corresponding block;
   transmitting at least one other command to the memory device, to trigger the memory device to generate the respective ECC error bit counts of the pages of the corresponding block while reading the data from the pages of the corresponding block; and
   obtaining the respective ECC error bit counts of the pages of the corresponding block from the memory device, for being stored as said each page ECC error table.

3. The method of claim 2, wherein regarding writing the data into the pages of the corresponding block, the memory device performs ECC encoding to protect the data; and regarding reading the data from the pages of the corresponding block, when one or more error bits exist in any page within the pages, the memory device performs ECC decoding to correct the one or more error bits.

4. The method of claim 2, wherein the at least one other command comprises at least one reading command.

5. The method of claim 1, wherein the step of finding the respective local risky pages of the N blocks within the plurality of blocks according to the set of page ECC error tables respectively to generate the local risky page counts respectively corresponding to the multiple page indexes further comprises:

accumulating a number of the respective local risky pages of the N blocks according to the multiple page indexes, to generate the local risky page counts respectively corresponding to the multiple page indexes.

6. The method of claim 1, wherein the step of finding the respective local risky pages of the N blocks within the plurality of blocks according to the set of page ECC error tables, respectively, to generate the local risky page counts respectively corresponding to the multiple page indexes further comprises:

regarding the corresponding block corresponding to said each page ECC error table, calculating an error bit count average and an error bit count standard deviation of the respective ECC error bit counts;

according to a product of a predetermined parameter and the error bit count standard deviation and according to the error bit count average, determining the first screening threshold, wherein the first screening threshold is equal to the error bit count average plus the product; and     checking whether an ECC error bit count of a page within the pages in the corresponding block reaches the first screening threshold, to selectively determine whether the page is a local risky page, wherein whether the page is a local risky page corresponds to whether the ECC error bit count of the page reaches the first screening threshold;

wherein under a condition where the respective ECC error bit counts conform to a distribution model, an expected value of a number of pages being local risky pages of a block is less than one.

7. The method of claim 6, wherein when the ECC error bit count of the page is greater than or equal to the first screening threshold, the page is a local risky page, otherwise, the page is not a local risky page.

8. The method of claim 6, wherein when the ECC error bit count of the page is greater than the first screening threshold, the page is a local risky page, otherwise, the page is not a local risky page.

9. The method of claim 6, wherein the distribution model is a normal distribution model.

10. The method of claim 1, wherein the step of finding the one or more global risky pages corresponding to the one or more page indexes of the multiple page indexes according to the local risky page counts further comprises:

calculating a page count average and a page count standard deviation of the local risky pages;

according to a product of a predetermined parameter and the page count standard deviation and according to the page count average, determining the second screening threshold, wherein the second screening threshold is equal to the page count average plus the product; and     checking whether a local risky page count within the local risky page counts reaches the second screening threshold, to selectively determine whether a corresponding page is a global risky page, wherein whether the corresponding page is a global risky page corresponds to whether the local risky page count of the corresponding page reaches the second screening threshold;

wherein under a condition where the local risky page counts conform to a distribution model, an expected value of a number of page indexes corresponding to global risky pages is less than one.

11. The method of claim 10, wherein when the local risky page count of the corresponding page is greater than or equal to the second screening threshold, the corresponding page is a global risky page, otherwise, the corresponding page is not a global risky page.

12. The method of claim 10, wherein when the local risky page count of the corresponding page is greater than the second screening threshold, the corresponding page is a global risky page, otherwise, the corresponding page is not a global risky page.

13. The method of claim 10, wherein the distribution model is a normal distribution model.

14. A memory device, comprising:

a non-volatile (NV) memory, arranged to store information, wherein the NV memory comprises one or more NV memory elements, and the one or more NV memory elements comprises a plurality of blocks; and     a controller, coupled to the NV memory, arranged to control operations of the memory device, wherein the controller comprises:

a processing circuit, arranged to control the controller according to a plurality of host commands from a host device, to allow the memory device to access the NV memory through the controller;

wherein the memory device is coupled to a page availability management system for performing page availability management of the memory device, and the page availability management comprises:

the page availability management system obtains a set of page Error Correction Code (ECC) error tables of the NV memory, wherein the set of page ECC error tables correspond to the plurality of blocks, respectively, and each page ECC error table within the set of page ECC error tables comprises respective ECC error bit counts of pages of a corresponding block within the plurality of blocks;

based on a predetermined rule, the page availability management system finds respective local risky pages of N blocks within the plurality of blocks according to the set of page ECC error tables, respectively, to generate local risky page counts respectively corresponding to multiple page indexes, wherein N is greater than one, the multiple page indexes correspond to respective pages of each of the plurality of blocks, respectively, and as for a single block within the N blocks, one or more ECC error bit counts of one or more local risky pages existing in the single block are not less than a first screening threshold;

the page availability management system finds one or more global risky pages corresponding to one or more page indexes of the multiple page indexes according to the local risky page counts, wherein one or more local risky page counts corresponding to the one or more page indexes are not less than a second screening threshold; and         the page availability management system writes a global risky page table into the memory device, for controlling the memory device to skip using the one or more global risky pages of each of the plurality of blocks, wherein the global risky page table indicates the one or more global risky pages;

wherein each of the local risky page counts indicate a number of local risky pages within the N blocks regarding a corresponding page index;

wherein when an ECC error bit count of a certain page reaches the first screening threshold, the certain page is determined to be a local risky page;

and when a local risky page count corresponding to the certain page reaches the second screening threshold, the certain page is determined to be a global risky page;

wherein according to the global risky page table, the controller controls the memory device to skip using the one or more global risky pages of each of the plurality of blocks.

15. An electronic device, comprising:

a memory device, wherein the memory device comprises:

a non-volatile (NV) memory, arranged to store information, wherein the NV memory comprises one or more NV memory elements, and the one or more NV memory elements comprises a plurality of blocks; and a controller, coupled to the NV memory, arranged to control operations of the memory device, wherein the controller comprises:

a processing circuit, arranged to control the controller according to a plurality of host commands from a host device, to allow the memory device to access the NV memory through the controller; and the host device, coupled to the memory device, wherein the host device comprises:

at least one processor, arranged to control operations of the host device; and a power supply circuit, coupled to the at least one processor, arranged to provide the at least one processor and the memory device with power;

wherein the memory device is arranged to provide the host device with storage space;

wherein:

the host device obtains a set of page Error Correction Code (ECC) error tables of the NV memory, wherein the set of page ECC error tables correspond to the plurality of blocks, respectively, and each page ECC error table within the set of page ECC error tables comprises respective ECC error bit counts of pages of a corresponding block within the plurality of blocks;

based on a predetermined rule, the host device finds respective local risky pages of N blocks within the plurality of blocks according to the set of page ECC error tables, respectively, to generate local risky page counts respectively corresponding to multiple page indexes, wherein N is greater than one, the multiple page indexes correspond to respective pages of each of the plurality of blocks, respectively, and as for a single block within the N blocks, one or more ECC error bit counts of one or more local risky pages existing in the single block are not less than a first screening threshold;

the host device finds one or more global risky pages corresponding to one or more page indexes of the multiple page indexes according to the local risky page counts, wherein one or more local risky page counts corresponding to the one or more page indexes are not less than a second screening threshold; and the host device writes a global risky page table into the memory device, for controlling the memory device to skip using the one or more global risky pages of each of the plurality of blocks, wherein the global risky page table indicates the one or more global risky pages;

wherein each of the local risky page counts indicate a number of local risky pages within the N blocks regarding a corresponding page index;

wherein when an ECC error bit count of a certain page reaches the first screening threshold, the certain page is determined to be a local risky page;

and when a local risky page count corresponding to the certain page reaches the second screening threshold, the certain page is determined to be a global risky page.

16. A page availability management system, wherein the page availability management system is coupled to a memory device, the memory device comprises a non-volatile (NV) memory, the NV memory comprises one or more NV memory elements, the one or more NV memory elements comprises a plurality of blocks, and the page availability management system comprises:

a processing circuit, arranged to control the page availability management system to perform page availability management, wherein the page availability management comprises:

the page availability management system obtains a set of page Error Correction Code (ECC) error tables of the NV memory, wherein the set of page ECC error tables correspond to the plurality of blocks, respectively, and each page ECC error table within the set of page ECC error tables comprises respective ECC error bit counts of pages of a corresponding block within the plurality of blocks;

based on a predetermined rule, the page availability management system finds respective local risky pages of N blocks within the plurality of blocks according to the set of page ECC error tables, respectively, to generate local risky page counts respectively corresponding to multiple page indexes, wherein N is greater than one, the multiple page indexes correspond to respective pages of each of the plurality of blocks, respectively, and as for a single block within the N blocks, one or more ECC error bit counts of one or more local risky pages existing in the single block are not less than a first screening threshold;

the page availability management system finds one or more global risky pages corresponding to one or more page indexes of the multiple page indexes according to the local risky page counts, wherein one or more local risky page counts corresponding to the one or more page indexes are not less than a second screening threshold; and the page availability management system writes a global risky page table into the memory device, for controlling the memory device to skip using the one or more global risky pages of each of the plurality of blocks, wherein the global risky page table indicates the one or more global risky pages;

wherein each of the local risky page counts indicate a number of local risky pages within the N blocks regarding a corresponding page index;

wherein when an ECC error bit count of a certain page reaches the first screening threshold, the certain page is determined to be a local risky page;

and when a local risky page count corresponding to the certain page reaches the second screening threshold, the certain page is determined to be a global risky page.

17. The page availability management system of claim 16, wherein the page availability management system is a host device.

\* \* \* \* \*